United States Patent [19]
Ghilardelli

[11] Patent Number: 6,111,791
[45] Date of Patent: Aug. 29, 2000

[54] CIRCUIT DEVICE AND CORRESPONDING METHOD FOR PROGRAMMING A NONVOLATILE MEMORY CELL HAVING A SINGLE VOLTAGE SUPPLY

[75] Inventor: Andrea Ghilardelli, Cinisello Balsamo, Italy

[73] Assignee: STMicroelectronics, S.r.l., Agrate Brianza, Italy

[21] Appl. No.: 09/322,644

[22] Filed: May 28, 1999

[30] Foreign Application Priority Data

May 29, 1998 [IT] Italy ................................ MI98A1193

[51] Int. Cl.⁷ ........................... G11C 16/04; G11C 16/06
[52] U.S. Cl. .................. 365/185.28; 365/185.21
[58] Field of Search ........................ 365/185.21, 185.28, 365/185.2, 185.29

[56] References Cited

U.S. PATENT DOCUMENTS

| | | | |
|---|---|---|---|
| 4,954,990 | 9/1990 | Vider | 365/185 |
| 5,335,198 | 8/1994 | Van Buskirk et al. | 365/185.21 |
| 5,748,534 | 5/1998 | Dunlap et al. | 365/185.21 |
| 5,973,959 | 10/1999 | Gerna et al. | 365/185.03 |

*Primary Examiner*—Son Mai
*Attorney, Agent, or Firm*—Theodore E. Galanthay, Esq.; Robert Iannucci, Esq.; Seed IP Law Group, PLLC

[57] ABSTRACT

A circuit device programs non-volatile memory cells having a single voltage supply, wherein each cell comprises a floating gate transistor having source and drain terminals and a control gate terminal, with the drain terminal being supplied a program voltage from a voltage booster circuit. The device includes a means of supplying a constant drain current to the drain terminal of the memory cell; an element for sampling the drain current drawn through the cell; and a means of voltage feedback driving the control gate terminal of the cell according to the sampled value of the drain current.

17 Claims, 5 Drawing Sheets

CIRCUIT DEVICE AND CORRESPONDING METHOD FOR PROGRAMMING A NONVOLATILE MEMORY CELL HAVING A SINGLE VOLTAGE SUPPLY

TECHNICAL FIELD

This invention relates to a method and a circuit device for programming a nonvolatile memory cell having a single supply voltage.

In particular, the invention relates to a circuit device for programming non-volatile memory cells having a single voltage supply, wherein each cell comprises a floating gate transistor having source and drain terminals and a control gate terminal, with the drain terminal being supplied a program voltage from a voltage booster circuit.

BACKGROUND OF THE INVENTION

In semiconductor-integrated non-volatile memory devices, such as Flash memories, having a single voltage supply, program voltages and currents must be generated internally of the device by charge pumps. Conventional charge pumps have a voltage/current characteristic of the kind illustrated in FIG. 1.

Figure 1:
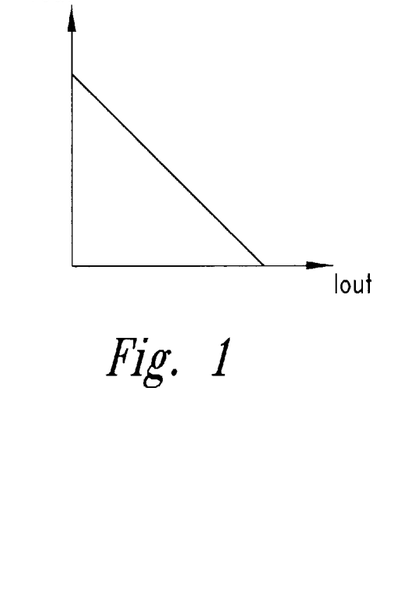
FIG. 1 shows schematically a characteristic current/voltage curve for a positive charge pump as incorporated in an electronic non-volatile memory device integrated in a semiconductor and having a single voltage supply.

As can be seen from this figure, the larger the current to be output, the smaller is the voltage value that the pump can provide. Accordingly, charge pumps can only supply current in limited amounts.

In a Flash memory with a single supply voltage, the most critical voltage to generate is the voltage to be supplied to the drain terminal of the Flash cell at the programming stage. At this stage, in fact, the voltage to be supplied to the drain is $V_{Dprg} \cong 5$ V, while the current required is $I_{Dprg} \cong 500$ $\mu$A/cell. Where eight bits (equal to one byte) are to be programmed simultaneously, the total current to be delivered will be 500 $\mu$A·8=4 mA. Where sixteen bits (i.e., a memory word) are to be programmed simultaneously, the current to be delivered will be 8 mA.

It will be appreciated that, in order to supply such current values, the charge pumps connected to the drain terminal must be quite large, and are bound to draw much of the supply current. This disadvantage has a side effect in that noise is also produced.

This situation is fairly critical as such, and is aggravated by two aspects:

1) Initial Current Peak

During the programming phase, constant voltage values are normally supplied to both the drain and gate terminals of the Flash cell. These values are illustratively shown in the accompanying FIG. 2.

Figure 3:
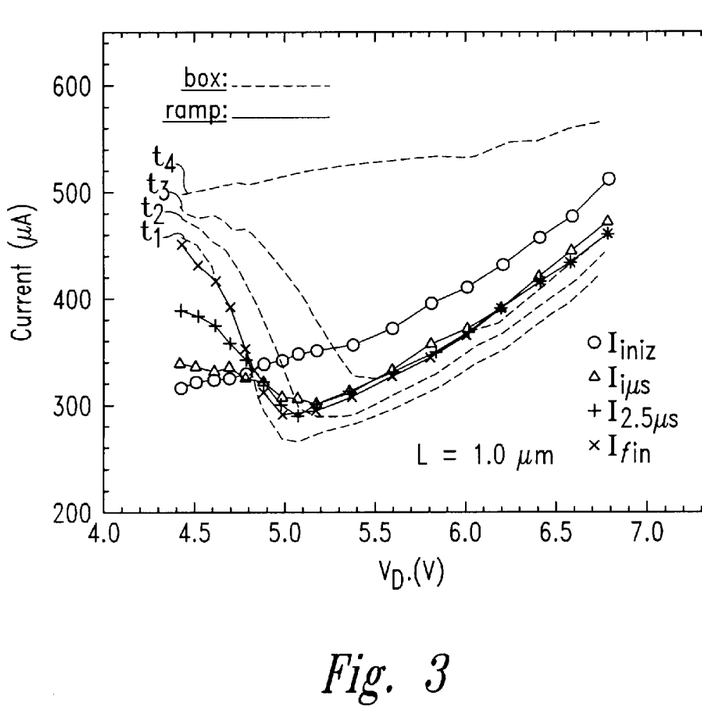
FIG. 3 shows schematically a set of voltage/current curves at the drain terminal of the memory cells, as plotted versus the drain voltage and parameterized on the basis of a discrete point in time.

The pattern of the drain current over time can be appreciated from the phantom line plots shown in FIG. 3, where several curves for the drain current at the programming stage are plotted versus drain voltage and parameterized on the basis of a discrete time ti, it being t1<t2<t3<t4.

Figure 5:
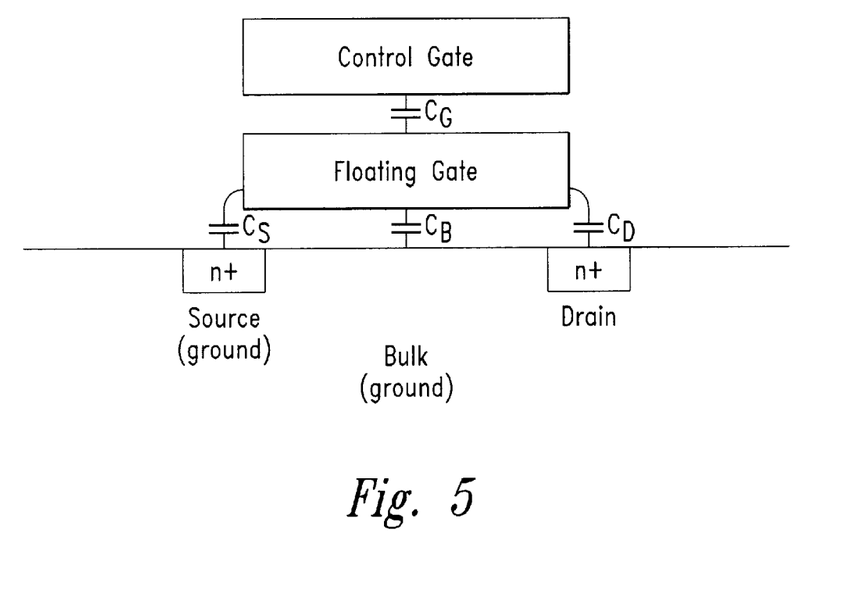
FIG. 5 is a schematic view of a non-volatile memory cell bringing out its capacitive couplings.

As shown in the figure, the drain current has, at any values of the drain voltage, a sharp initial peak which then flattens out over time. This peak is caused by the floating gate, which has no electrons at the start, becoming charged with electrons during the programming phase. The electrons screen off the positive gate voltage, which results in the threshold voltage of the Flash cell being raised and the cell conducting less current for a given control gate voltage applied thereto. The phenomenon can be expressed analytically as follows:

$$V_{FG}=\alpha_S V_S+\alpha_G V_{CG}\alpha_D V_D+\alpha_B V_B+Q/C_T=\alpha_G V_{CG}\alpha_D V_D+Q/C_T \quad (A)$$

where: $V_{FG}$ is the floating gate voltage; the subscripts S, G, D and B respectively denote the source, gate, drain, and bulk terminals $V_{CG}$ is the control gate voltage; $\alpha_X=C_X/C_T$; $C_T=C_S+C_B+C_D+C_G$; Q is the charge build-up on the floating gate. The capacitive couplings are depicted schematically in FIG. 5. During the programming, VFG decreases because the negative charge Q increases in size.

Figure 4:
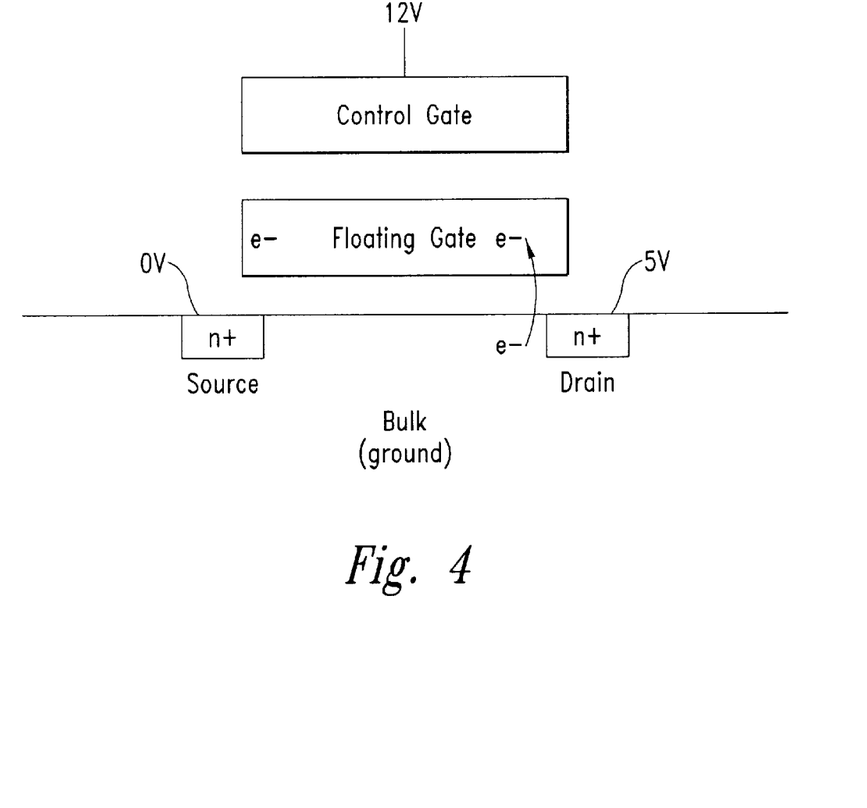
FIG. 4 shows schematically a non-volatile memory cell while being programmed.

Notice that $V_S$ and $V_B$ are zero as shown in FIG. 4.

The values given above in relation to the drain current ($I_{Dprg} \cong 500$ mA/cell) are mean values; the initial peak in current draw would just aggravate the situation, since the current that the drain pumps are to supply for a given voltage ($V_{Dprg} \cong 5$ V) would have to be even larger and equal to the peak current. This means that larger charge pumps must be provided, thereby increasing power consumption and generating more noise.

2) Current Increase Based on Process and Temperature Variations

Due to process variations, affecting especially the channel length of the cell, and to variations in the temperature at which the programming phase is performed, the drain current under critical conditions may even be twice as large as that under normal conditions. For example, critical may be a condition of cells having a channel length which is slightly smaller than average, and being operated at a low temperature.

Here again, the charge pumps have to be made larger, more power is consumed and noise generated, because they must be capable of delivering the maximum required current.

Figure 6:
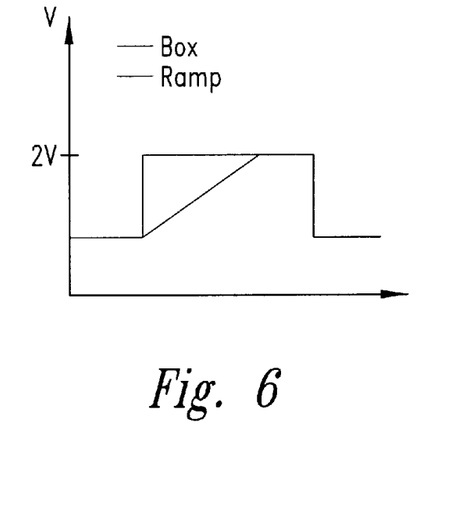
FIG. 6 shows schematically a voltage/time graph illustrating the pattern of the voltage applied to the gate terminal of a memory cell at the programming stage, according to the prior art.

The prior art proposes a solution effective to obviate in part the problem mentioned under (1) above. To attenuate this problem it is common practice to have the gate supplied, rather than a fixed voltage, a voltage which increases over time according to a pattern which may be linear, exponential, stepwise, or else, such as that shown schematically in FIG. 6.

Thus, an effort is made to compensate for the negative charge being built up on the floating gate by providing an increasingly more positive voltage at the control gate; according to formula (A) under (1) above, this is equivalent to increasing the voltage $V_{CG}$ in order to compensate for the negative charge Q which is being built up. In this way, the floating gate voltage $V_{FG}$ is held constant and with it, the drain current as well.

Figure 2:
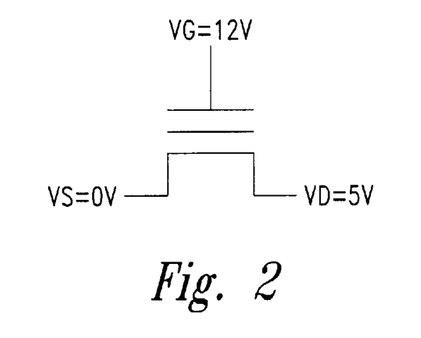
FIG. 2 shows schematically a non-volatile memory cell along with an indication of the programming voltage values at the source, drain and gate terminals.

This approach slightly lowers the programming efficiency below that to be achieved by applying constant value voltage like those shown in FIG. 2. In other words, for a given programming time, the threshold jump can be less; that is, the programming time must be lengthened for a given threshold jump.

This is caused by the mean transverse electric field between the gate and drain terminals being smaller in the instance of a growing gate voltage than in the instance of a constant voltage, even though the end value of the gate voltage may be the same in either instances. However, this partial loss in efficiency at the programming stage is outweighed by a significantly lower initial current peak.

Plotted in FIG. 3 are full line curves as obtained by programming with a ramp on the gate, and it can be appreciated that their initial current peaks are limited.

While being advantageous from this standpoint, this prior solution still has drawbacks. In particular, it can be seen from FIG. 3 that, at useful drain voltages ($V_D$>4.5 V), a larger initial current persists all the same. This necessitates fairly large charge pumps, since they must be capable of supplying a relatively large initial current value, that is, they must have a relatively high pickup.

The capability to initially supply a fairly large current is unused, however, during the rest of the programming phase for which the current decreases.

It matters to also observe that the larger the drain current, the larger becomes the gate current, or the higher becomes the programming efficiency, because of the increased number of hot channel electrons.

However, the methods adopted heretofore have failed to provide a constant drain current, since they are based on an increase in gate voltage over time which is unrelated to the drain current being actually conducted by the cell each time. The gate voltage is increased linearly, exponentially, stepwise, or in some other "predictive" forms, that is set once for all on the basis of a predetermined pattern at the designing stage. An increase of this kind in the gate voltage obviously cannot provide a constant drain current, because the latter would change between chips due to variations occurring in the fabrication process, change between cells in the same chip, and for each cell, change with temperature.

In essence, prior solutions have failed to provide a constant drain current. This can also be seen from FIG. 3 showing that the drain current does not remain constant over time during the programming, even with a ramp-type programming.

As a further solution, it could be conceived of achieving constant current programming by selecting an appropriate value for the drain voltage, e.g., at the crosspoint X of the full line curves, at approximately 4.8–4.9 V. At this crosspoint X, current is indeed near-constant from the programming start to its end.

Actually, this solution is not practicable for a number of reasons. First, the crosspoint X position varies within a wide range according to process variations, and in particular on the basis of unavoidable variations in the cell lengths and in temperature.

The location of the crosspoint X is also dependent on the highest obtainable gate voltage and on the ramp rate, which is not easy to control.

Finally, the drain voltage should be selected for the highest possible efficiency and according to the programming duration sought, and this value may not coincide with the curve crosspoint X.

SUMMARY OF THE INVENTION

An embodiment of this invention provides a circuit device and method for programming a non-volatile memory cell having a single supply voltage which can effectively overcome the aforementioned limitations and drawbacks of the prior art. The embodiment effects the memory cell programming with a constant drain current, and of gradually increasing the control gate voltage over time to compensate for the negative charge being built up on the floating gate. In this way, the potential at the floating gate and the drain current can be made constant.

Advantageously, the increase in the control gate voltage is related to the current actually being conducted by the cell, such that the drain current can be effectively controlled and rendered constant.

The device includes means for supplying a constant drain current to the drain terminal of the memory cell; an element for sampling the drain current drawn through the cell; and means for voltage feedback driving the control gate terminal of the cell according to the sampled value of the drain current.

The method comprises:
supplying a constant drain current (ID) to the drain terminal of the cell (2);
sampling the value of the drain current (ID) being drawn through the cell (2);
gradually increasing over time the voltage at the control gate terminal (G) to compensate for the negative charge being built up on the floating gate;
correlating the voltage value at the control gate terminal (G) and the actual sampled value of the drain current being drawn through the cell.

The features and advantages of a device and method according to an embodiment of the invention will be apparent from the following description of embodiments thereof, given by way of non-limitative examples with reference to the accompanying drawings.

DETAILED DESCRIPTION

Figure 7:
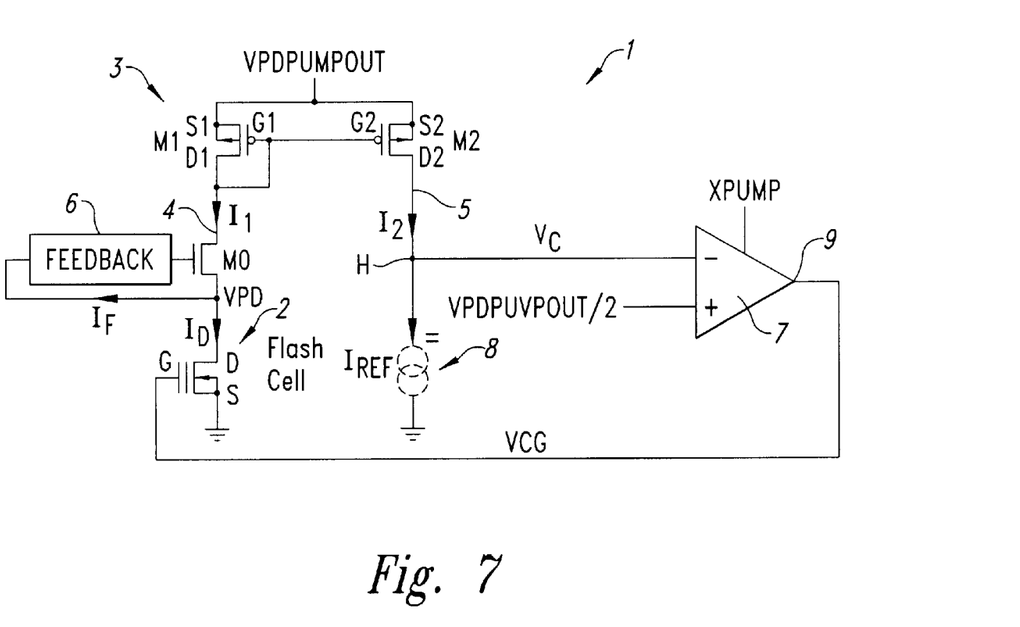
FIG. 7 is a diagrammatic view of the circuit device according to an embodiment of this invention.

Referring to the figures, specifically to the example in FIG. 7, generally and schematically shown at 1 is a circuit device intended for programming a non-volatile memory cell 2 having a single supply voltage.

The cell 2 is of the electrically erasable and programmable Flash EEPROM type. However, the inventive principles could be applied to any other types of non-volatile memory cells.

The cell 2 comprises a floating gate MOS transistor having a conduction terminal, its source terminal S, connected to ground.

The circuit device 1 advantageously includes an element 3 for sampling the current $I_D$ of the drain D of the Flash cell 2.

Specifically, this sampling element 3 is a transistor M1 of the PMOS type having its source terminal S1 connected to a voltage reference $V_{PDPUMPOUT}$ provided by a charge pump circuit not shown because conventional.

The drain terminal D1 of the transistor M1 is connected to the drain terminal D of the cell 2 through an NMOS transistor M0 which has a conduction terminal feedback connected to its control terminal via a feedback block 6 adapted to keep the voltage value $V_{PD}$ constant and to decouple the two nodes D1 and D.

The transistors M1, M0 and the floating gate transistor of the cell 2 form a first circuit leg 4.

A second circuit leg 5 of the device 1 comprises a transistor M2 of the PMOS type which has a gate terminal G2 connected to the gate terminal G1 of the transistor M1. In addition, the source terminal of the transistor M2 is connected to the voltage reference $V_{PDPUMPOUT}$.

The circuit legs 4 and 5 are connected to form a current mirror structure such that the current $I_2$ is proportional to the current $I_1$. The current mirror formed of the transistors M1 and M2 is supplied the output from the charge pump to produce the voltage $V_{PDPUMPOUT}$ for biasing the drain of the cell 2.

The construction of the circuit 1 is completed by an operational amplifier 7 functioning as a comparator and a generator 8 that generates a reference current $I_{REF}$. The drain terminal D2 of the transistor M2 of the second circuit leg 5 is connected to the generator 8 at a node H which is further connected to the inverting (−) input of the amplifier 7.

The non-inverting (+) input of the amplifier 7 is held at a potential given as $V_{PDPUMPOUT}/2$. The output 9 of the amplifier 7 is coupled to the control gate terminal G of the cell 2.

The current I2 mirrored in the leg 5 is compared to the reference current $I_{REF}$ of the generator 8. The node H, at a voltage $V_C$, intermediate M2 and the generator 8, allows the voltage $V_C$ to be sampled and compared to one half the voltage $V_{PDPUMPOUT}$ ($V_{PDPUMPOUT}/2$). Where $V_{PDPUMPOUT}/2 > V_C$, the output 9 from the amplifier increases; where instead $V_{PDPUMPOUT}/2 < V_C$, the output 9 from the amplifier 7 decreases.

The output 9 from the operational amplifier 7 serves to supply the voltage to the gate of the cell 2.

The amplifier 7 is supplied a suitable boost voltage XPUMP. The amplifier 7 could be a simple differential amplifier.

To best appreciate the operation of the device 1, it should be considered that the following relationship applies:

$$I_D + I_F = I_1$$

where, $I_F$ is the current needed by the feedback block 6 in order to provide a constant voltage $V_{PD}$. Since in single supply voltage Flash memories the voltage $V_{PD}$ must be provided by a charge pump having a limited capacity for current, the current $I_F$ picked up to sample the drain voltage should be quite small, on the order of a few μA. Since the program current $I_D$ of a cell is approximately 500 μA, the sampling current $I_F$ is negligible compared to $I_D$; therefore, it can be assumed $I_D \cong I_1$.

Thus, the drain current $I_D$ of the Flash cell is sampled through the element 3, the transistor M1. This transistor forms, in combination with the transistor M2, the aforementioned current mirror, so that:

$$I_2 = I_1[(W2/L2)/(W1/L1)] = nI_1$$

where, Wi and Li are the width and length, respectively, of the i-th transistor and n is a constant.

As can be seen, the device 1 is fed back negatively. In fact, the current $I_D$ will increase with the currents $I_1$ and $I_2$. Since $I_{REF}$ is constant, the voltage $V_C$ itself increases, thereby pulling down the voltage at the output 9 of the amplifier 7; this causes a decrease in the voltage applied to the gate G of the Flash cell 2, and the cell will conduct less current.

The smaller current drawn through the cell 2 brings about a decrease in the current $I_D$, which had originally been assumed to increase.

The balance point will occur when $V_{PDPUMPOUT}/2 = V_C$. This takes place upon $M_{REF} = I_2$. Thus, in the balanced condition, it will be:

$$I_{REF} \cong I_2 \cong nI_1 \cong nI_D \Rightarrow I_{REF} = nI_D \qquad (1).$$

By suitably dimensioning the transistors M1, M2 and the generator 8, the drain current $I_D$ of the cell 2 can be set and, accordingly, held constant.

The transistor M0 has a dual function. First, it decouples the transistor M1 from the drain D of the cell. This is useful in that the gate of M1 should be let free to settle on the value at which a current equal to $I_D$ is flowed through M1, while the drain voltage $V_{PD}$ of the cell should be selected for as efficient a programming as possible: therefore, the two voltages should be decoupled.

The other function of the transistor M0 is to regulate the drain voltage $V_{PD}$ of the cell. This is done through the feedback block referenced FEEDBACK, which will sample the drain voltage $V_{PD}$ and regulate the gate voltage of M0 accordingly, in a source-follower configuration; in this way, a desired voltage $V_{PD}$ is set.

A PMOS transistor could be substituted for the NMOS transistor M0 and connected in exactly the same manner. The FEEDBACK block 6 would have to be adjusted accordingly.

In essence, based on the concepts of this invention, it becomes possible to set the drain voltage $V_{PD}$ of the cell and its drain current $I_D$, and to vary the voltage $V_{CG}$ of the control gate G. Thus, a constant floating gate voltage can be provided.

It is important to observe that the example shown schematically in FIG. 7 is illustrative only.

Specifically:

A) The current mirror formed of the transistors M1 and M2 could be of another type, e.g., a cascode type.

B) The operational amplifier 7 could be a simple differential amplifier.

C) It is not necessary for the operational amplifier 7 to be supplied a boost voltage XPUMP, it being sufficient that at least its output stage be so supplied; the remaining circuit portion may be supplied the standard voltage VDD.

Figure 8:
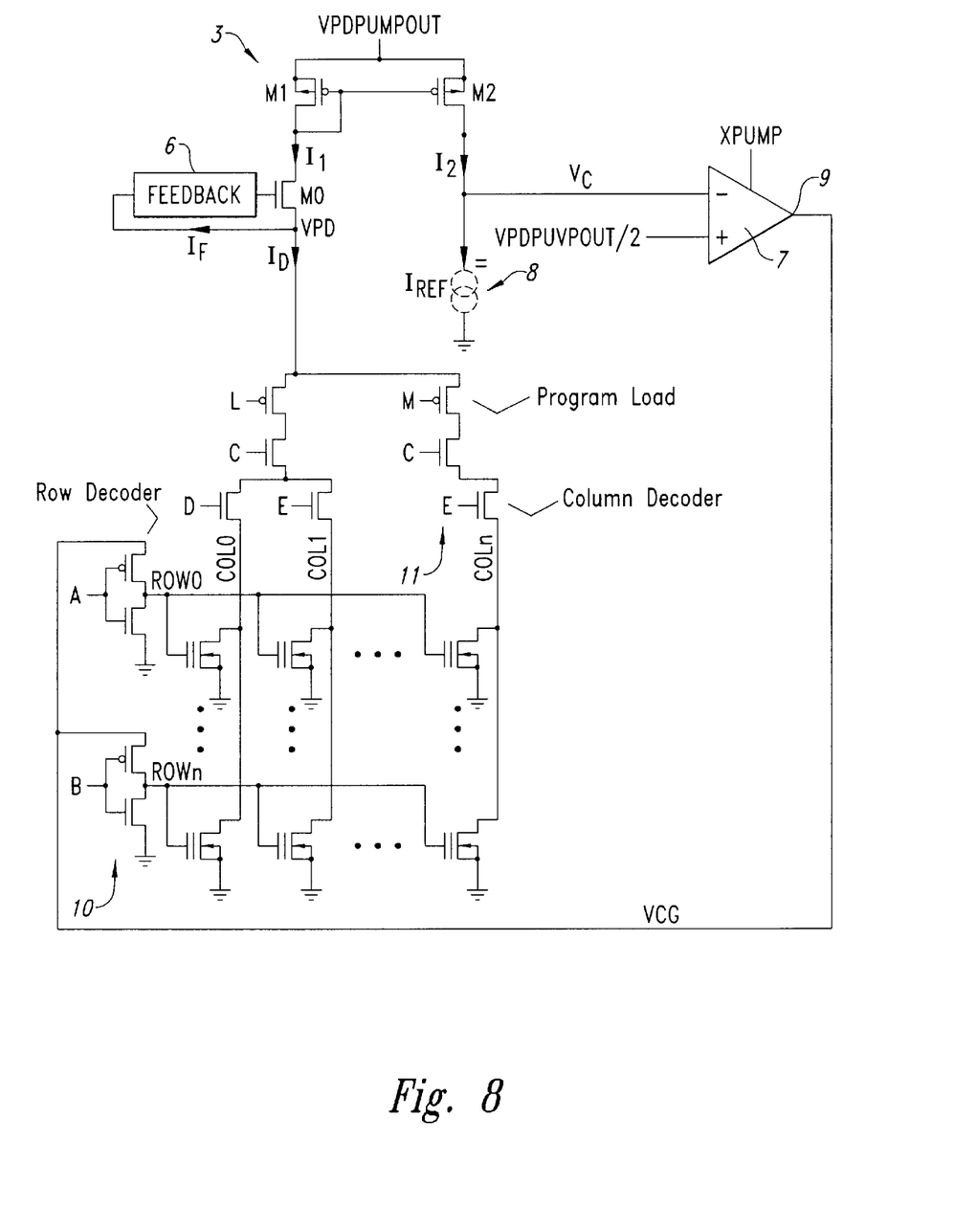
FIG. 8 is a schematic view showing in greater detail the circuit of the device in FIG. 7.

D) Shown in FIG. 8 are respective-row and column decode circuit portions 10 and 11. The row decoder 10 is interposed between the output 9 of the operational amplifier and the gate of the Flash cell, while the column decoder 11 is interposed between the source terminal of M0 and the drain of the Flash cell.

In either case, however, the decode circuit portions are always designed to pass the generated voltages ($V_{CG}$ and $V_{PD}$ in this instance) in as unchanged a condition as possible.

E) The cells to be programmed may be from one to eight, where the programming is by byte, or from one to sixteen where the programming is by memory word. In either case, the cells will belong to the same row and, therefore, have of necessity the same gate voltage, e.g., as shown in FIG. 8. Consequently, the voltage $V_{CG}$ of FIG. 7 will be shared by all the cells to be programmed, and only the mean of the currents pulled by the cells being programmed can be taken into account.

Here again, the simplest and most convenient of constructions is that shown in FIG. 7, with the single difference that connected to the node $V_{PD}$ through the column decoding will now be all the drains of the cells to be programmed, rather than a single Flash cell, so that the current $I_1$ is the sum of the program currents of all the cells to be programmed. For a lower power consumption, it will be expedient to select n<1 in relationship (1).

Figure 9:
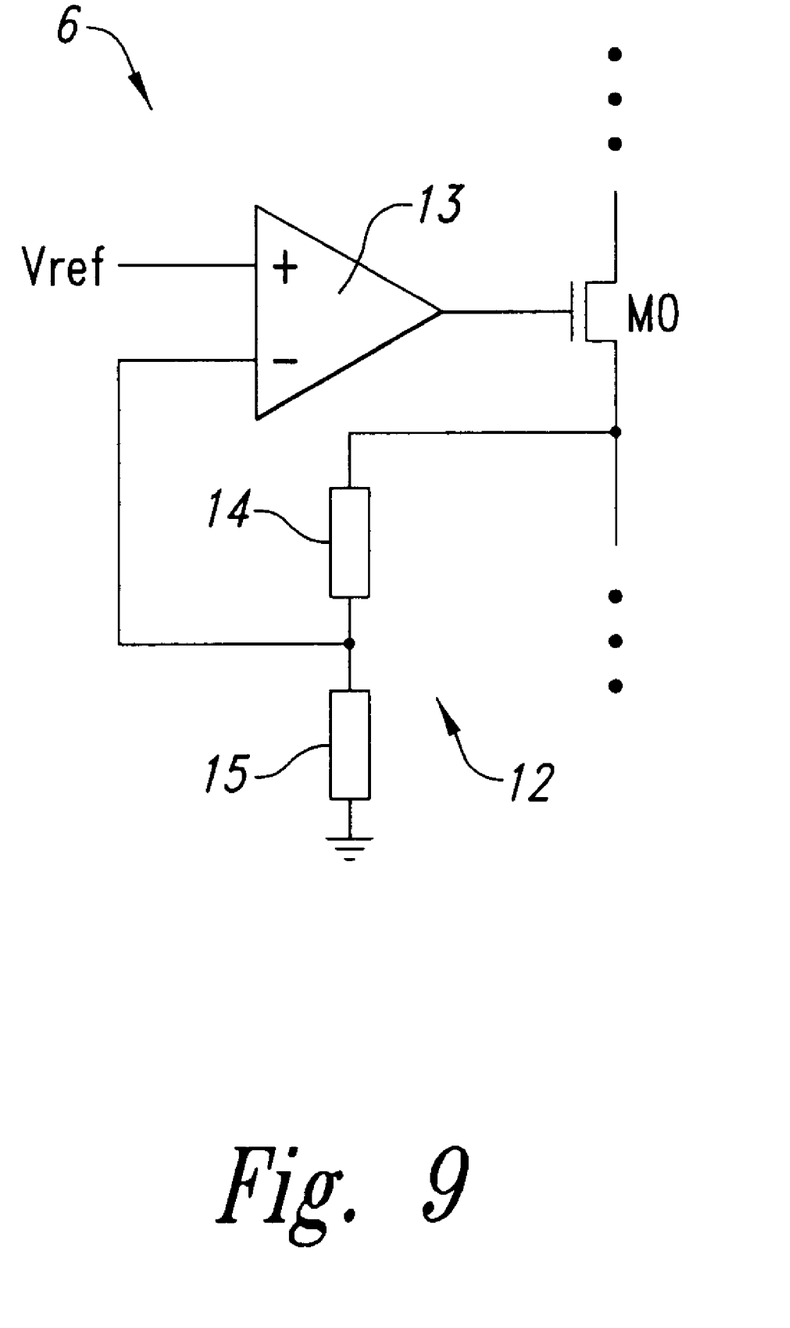
FIG. 9 is a schematic view of a feedback block of the circuit of FIG. 7.

Shown in FIG. 9 is a circuit diagram of the feedback block 6 of FIGS. 7 and 8, although those skilled in the art will recognize that other circuit arrangements could be employed. The feedback block 6 includes a voltage divider 12 and a differential amplifier 13. The voltage divider includes first and second impedance elements 14, 15, such as resistors, connected between the source terminal of the transistor M0 and ground. The differential amplifier 13 has a non-inverting terminal coupled to a voltage reference Vref, an inverting terminal coupled to a voltage divider node 16 between the impedance elements 14, 15, and an output terminal coupled to the gate of the transistor M0. The values of Vref and the impedance elements 14,15 uniquely determine the voltage level output by the differential amplifier 13 to the gate of transistor M0, which is placed in a source follower configuration.

The device and method discussed herein achieve a number of advantages, foremost among which is that they ensure the programming of a Flash cell with a constant drain current.

The circuit 1 affords active control on the drain current of the cell 2, such that it can be held truly constant. The solutions proposed heretofore by the prior art, while enabling the initial drain current peak to be lowered, fail to make this current constant.

The circuit 1 allows the control gate voltage to be increased over time, but this increase occurs with the drain current being monitored continually.

Additional advantages are listed here below.

1) The problem of the initial current peak is fully overcome, rather than attenuated as in the prior art. In essence, the initial current is no longer larger than the steady state or final currents, and as a result, smaller and less noisy charge pumps, dissipating less power, can be provided.

2) The problem of the increased current from process and temperature variations is also overcome. In fact, the same drain current is also received by unusually short (in terms of channel length) cells or cells programmed at a low temperature.

By supplying a constant current during the programming, the problems connected with process variations and variations in the temperature at which the programming is carried out can be overcome. In this way, the charge pumps arranged to supply the drain current can be made smaller, less noisy, and to dissipate less power, because the current to be supplied is smaller. This involves no penalty for the programming times set by the specifications.

In fact, a shorter cell or a cell programmed at a low temperature, although conducting more current, can be programmed in less time. Thus, it is unnecessary to supply it with all the current that it requires, if the programming time specified is based on the slowest cells to become programmed (e.g., the longer cells or the cells programmed at a high temperature, which conduct less current).

3) It can be appreciated from FIG. 3 that even where a voltage ramp is applied to the gate, there always exists a difference between the maximum and minimum currents, resulting in inefficiency. Since the charge pumps are in all cases to be dimensioned for supplying the maximum required current, should the required current decrease during the programming, a loss in efficiency would be occasioned because of the smaller drain current, but the charge pumps would be capable of sustaining a larger current.

The circuit 1 allows a larger threshold jump for a given programming time. Conversely, it could be said that this circuit allows a given threshold jump in a shorter time. This because the programming takes place throughout at the largest possible drain current, which is the current supplied from the pumps.

This aspect is supplemented by an ability to program at a constant rate of hot electron injection, that is at a constant gate current. The gate current is constant because constant are the drain and floating gate voltages, and accordingly the longitudinal and transverse electric fields. Thus, the rate of hot electron injection into the floating gate is the same, that is, the whole time devoted to programming is equally utilized, instead of utilizing a minor part of it intensively and less so its major remaining part, as is the case with programming with a current which is not constant.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit device for programming non-volatile memory cells having a single voltage supply, wherein each cell includes a floating gate transistor having source and drain terminals and a control gate terminal, the device comprising: means for supplying a constant drain current to the drain terminal of the memory cell; a sampling element coupled to the supplying means and structured to sample the drain current drawn through the cell; and voltage feedback drive means, coupled to the supplying means, for driving the control gate terminal of the cell according to the sampled drain current, wherein the supplying means includes a decoupling transistor connected between a voltage reference and the drain terminal of the cell, and a feedback block connected between the drain terminal of the cell and a control terminal of the decoupling transistor, the decoupling transistor and feedback block being effective to regulate a voltage at the drain terminal of the cell.

2. A device according to claim 1, wherein said drive means includes means for transferring the sampled drain current into a comparator.

3. A device according to claim 2, wherein said transfer means comprises a current mirror.

4. A device according to claim 3, wherein said current mirror has a first leg wherein said sampling element is connected, and a second leg wherein a coupling transistor is provided for coupling to a terminal of a comparator.

5. A device according to claim 4, wherein said coupling transistor has a terminal connected to a reference current generator.

6. A device according to claim 2, wherein said transfer means comprises a cascode structure.

7. A device according to claim 1, wherein said drive means comprises a comparator having an output coupled to the control gate terminal of the cell.

8. A device according to claim 1, wherein said sampling element includes a transistor connected in a circuit leg which includes said memory cell.

9. A method for programming non-volatile memory cells having a single voltage supply, wherein each cell comprises a floating gate transistor having source and drain terminals, a control gate terminal, and a floating gate, comprising:

supplying a program voltage to the drain terminal from a voltage booster circuit;

supplying a constant drain current to the drain terminal of the cell;

sampling the value of the drain current being drawn through the cell;

gradually increasing over time a voltage at the control gate terminal to compensate for a negative charge being built up on the floating gate; and correlating the voltage at the control gate terminal and the sampled value of the drain current being drawn through the cell.

10. The method of claim 9 wherein the correlating act includes comparing a voltage that depends on the drain current with a reference voltage and driving the control gate terminal with a voltage that depends on the comparing act.

11. The method of claim 9 wherein the act of supplying a constant drain current includes mirroring a reference current from one leg of a current mirror to produce a mirrored current another leg that includes the cell, the mirror current being proportional to the reference current and equal to the drain current.

12. The method of claim 9, further comprising using the sampled drain current to hold the drain of the cell at a constant voltage.

13. A circuit device for programming a nonvolatile memory cell having a control terminal and first and second conduction terminals, the circuit device comprising:
- a first mirror transistor having a control terminal, a first conduction terminal coupled to a first voltage reference, and a second conduction terminal for coupling to the first conduction terminal of the memory cell;
- a second mirror transistor coupled in a current mirror arrangement with the first transistor, the second transistor having control and first conduction terminals coupled respectively to the control and first conduction terminals of the first transistor and having a second conduction terminal;
- a reference current generator coupled to the second conduction terminal of the second mirror transistor and structured to provide a reference current that is mirrored via the current mirror arrangement to provide a constant current to the first conduction terminal of the memory cell; and
- a decoupling transistor coupled between the second conduction terminal of the first transistor and the first conduction terminal of the memory cell.

14. The circuit device of claim 13, further comprising feedback circuitry having one terminal coupled between the decoupling transistor and the memory cell and a second terminal coupled to a control terminal of the decoupling transistor.

15. The circuit device of claim 14 wherein the feedback circuitry includes:
- a differential amplifier having a first input terminal coupled to a second voltage reference, a second input terminal, and an output terminal coupled to the control terminal of the decoupling transistor; and
- a voltage divider having a first impedance element coupled between the first conduction terminal of the memory cell and the second input terminal of the differential amplifier and a second impedance element coupled between the second input terminal of the differential amplifier and a third voltage reference.

16. The circuit device of claim 13, further comprising an operational amplifier having a first input coupled between the second conduction terminal of the second mirror transistor and the reference current generator, a second input coupled to a second voltage reference, and an output for coupling to the control terminal of the memory cell.

17. The circuit device of claim 13 wherein the first mirror transistor has its control terminal coupled to its second conduction terminal.

* * * * *